(12) United States Patent
Tsien et al.

(10) Patent No.: US 10,403,351 B1
(45) Date of Patent: Sep. 3, 2019

(54) SAVE AND RESTORE SCOREBOARD

(71) Applicant: Advanced Micro Devices, Inc., Santa Clara, CA (US)

(72) Inventors: Benjamin Tsien, Fremont, CA (US); Chintan S. Patel, Bee Cave, TX (US); Vamsi Krishna Alla, Austin, TX (US); Alan Dodson Smith, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/902,580

(22) Filed: Feb. 22, 2018

(51) Int. Cl.
*G11C 7/00* (2006.01)
*G11C 11/406* (2006.01)
*G06F 13/16* (2006.01)

(52) U.S. Cl.
CPC .... *G11C 11/40603* (2013.01); *G06F 13/1636* (2013.01); *G11C 11/40611* (2013.01); *G11C 2211/406* (2013.01)

(58) Field of Classification Search
CPC ......... G11C 11/40603; G11C 11/40611; G11C 2211/406
See application file for complete search history.

(56) References Cited

U.S. PATENT DOCUMENTS

| | | | |
|---|---|---|---|
| 5,974,512 A | 10/1999 | Chiba | |
| 6,057,862 A * | 5/2000 | Margulis | G06F 13/1605 345/535 |
| 6,349,346 B1 * | 2/2002 | Hanrahan | G06F 9/3001 326/38 |

(Continued)

FOREIGN PATENT DOCUMENTS

| | | |
|---|---|---|
| EP | 0955583 A2 | 11/1999 |
| WO | 00/33188 A2 | 6/2000 |

(Continued)

OTHER PUBLICATIONS

Loh, et al., "A Processing-in-Memory Taxonomy and a Case for Studying Fixed-function PIM", In Near-Data Processing Workshop, 2013, 4 pages, http://www.cs.utah.edu/wondp/wondp2013-paper2-final.pdf. [Retrieved Dec. 17, 2015].

(Continued)

*Primary Examiner* — Pho M Luu
(74) *Attorney, Agent, or Firm* — Meyertons Hood Kivlin Kowert and Goetzel PC; Rory D. Rankin

(57) ABSTRACT

Systems, apparatuses, and methods for using a scoreboard to track updates to configuration state registers are disclosed. A system includes one or more processing nodes, one or more memory devices, a plurality of configuration state registers, and a communication fabric coupled to the processing unit(s) and memory device(s). The system uses a scoreboard to track updates to the configuration state registers during run-time. Prior to a node going into a power-gated state, the system stores only those configuration state registers that have changed. This reduces the amount of data written to memory on each transition into power-gated state, and increases the amount of time the node can spend in the power-gated state. Also, configuration state registers are grouped together to match the memory access granularity, and each group of configuration state registers has a corresponding scoreboard entry.

20 Claims, 7 Drawing Sheets

(56) References Cited

U.S. PATENT DOCUMENTS

| | | |
|---|---|---|
| 7,185,150 B1 | 2/2007 | Kogge |
| 7,509,511 B1 | 3/2009 | Barowski et al. |
| 9,268,627 B2 * | 2/2016 | Kraipak .............. G06F 11/0721 |
| 9,767,028 B2 | 9/2017 | Cheng et al. |
| 2003/0041138 A1 | 2/2003 | Kampe et al. |
| 2003/0191739 A1 | 10/2003 | Chatterjee et al. |
| 2006/0294323 A1 | 12/2006 | Armstrong et al. |
| 2006/0294337 A1 | 12/2006 | Hartung et al. |
| 2012/0005243 A1 | 1/2012 | Van Der et al. |
| 2014/0047263 A1 | 2/2014 | Coatney et al. |
| 2014/0254591 A1 | 9/2014 | Mahadevan et al. |

FOREIGN PATENT DOCUMENTS

| | | |
|---|---|---|
| WO | 2006/091846 A2 | 8/2006 |
| WO | 2013/048536 A1 | 4/2013 |

OTHER PUBLICATIONS

International Search Report and Written Opinion in International Application No. PCT/US2019/018727, dated May 14, 2019, 15 pages.

\* cited by examiner

SAVE AND RESTORE SCOREBOARD

BACKGROUND

Description of the Related Art

Computing systems are increasingly integrating large numbers of different types of components on a single chip or on multi-chip modules. The complexity and power consumption of a system increases with the number of different types of components. Power management is an important aspect of the design and operation of integrated circuits, especially those circuits that are integrated within mobile devices. Mobile devices typically rely on battery power, and reducing power consumption in the integrated circuits can increase the life of the battery as well as decrease the heat generated by the integrated circuits. To achieve reduced power consumption, various components within an integrated circuit can go into a reduced power state or a power-gating state. As used herein, a "power-gating state" refers to a reduced power state when a component is operating in a mode in which the component is consuming less power than in a normal operating mode. For example, a "power-gating state" can involve turning off or removing power from a given component. Alternatively, a "power-gating state" can involve reducing a power supply voltage and/or reducing a clock frequency supplied to a given component. It is noted that a "power-gating state" can also be referred to as a "power-gated state" or a "power-gated mode". In various embodiments, a power-gated state refers to a reduced power state in which a current state of a device or component is not retained (i.e., power that would ordinarily be used to retain such a state is removed in order to consume less power).

Some computing systems save a configuration register state to memory (e.g., dynamic random-access memory (DRAM)) prior to entering a power-gating state. Upon power-gating exit, the configuration register state is restored. As used herein, a "configuration register state" is defined as the values of a plurality of configuration registers which identify a given component of the computing system, define various features of the given component, and allow system software to interface with and/or control the operation of the given component. It is noted that configuration registers can also be referred to as control status registers (CSRs) or model specific registers (MSRs). A "configuration register state" can also be referred to as a "configuration space". The configuration registers can be the internal registers of a device of component, such as a communication fabric, memory controller, central processing unit (CPU), graphics processing unit (GPU), or other component. The operating system, device drivers, and diagnostic software typically access the configuration space during operation of the given component.

Saving the configuration register state to memory each time the system enters the power-gating state causes a delay which reduces the total amount of time spent in the power-gating state. Also, writing the entire configuration register state to memory incurs a power use penalty. Accordingly, improved techniques for managing the configuration register state when transitioning between different power states are desired.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for implementing a scoreboard to track register writes are disclosed herein. In one embodiment, a system includes at least one or more processing units, a communication fabric, a scoreboard, and a memory. The system uses the scoreboard to track configuration register writes so that those configuration registers which were not updated since a previous transition into a power-gated state will not trigger a save operation to memory. Typically, the configuration state does not change during run-time, so the filtering implemented by the scoreboard is expected to be effective in reducing writes to memory for each transition into the power-gated state.

In one embodiment, the memory for the system is implemented as one or more dynamic-random access memory (DRAM) devices. In certain DRAM types, write power is greater than read power, and so avoiding writes to DRAM can reduce the DRAM power of the configuration state saving operation by over half. In one embodiment, the scoreboard is implemented at the same access granularity as the DRAM devices. In this embodiment, registers saved to a DRAM channel will have the same access granularity as the DRAM channel and be collectively tracked by the same scoreboard entry.

In one embodiment, configuration register addressing is allocated sparsely within an address space. For example, the register addressing can be implemented over a large range of a Peripheral Component Interconnect Express (PCIe) address space. In one embodiment, an addressing scheme is used to avoid unnecessarily saving and restoring addressing holes between registers. This addressing scheme involves stitching together configuration registers into contiguous addresses used for the save and restore operations associated with power-gating. This contiguous address space can then facilitate determining which DRAM access chunk a register belongs to for scoreboard manipulation.

Figure 1:
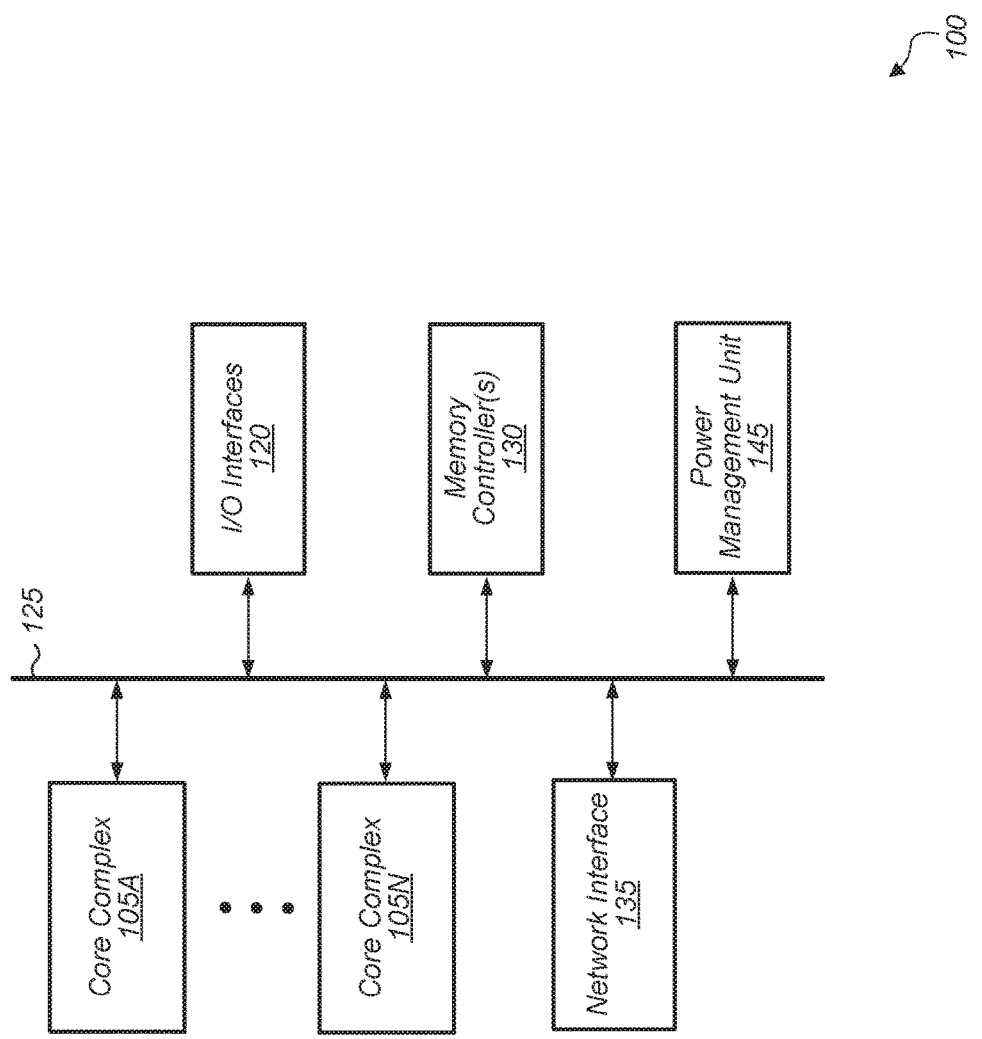
FIG. 1 is a block diagram of one embodiment of a computing system.

Referring now to FIG. 1, a block diagram of one embodiment of a computing system 100 is shown. In one embodiment, computing system 100 includes at least core complexes 105A-N, input/output (I/O) interfaces 120, bus 125, memory controller(s) 130, network interface 135, and power management unit 145. In other embodiments, computing system 100 can include other components and/or computing system 100 can be arranged differently. In one embodiment, each core complex 105A-N includes one or more general purpose processors, such as central processing units (CPUs). It is noted that a "core complex" can also be referred to as a "processing node" or a "CPU" herein. In some embodiments, one or more core complexes 105A-N can include a data parallel processor with a highly parallel architecture. Examples of data parallel processors include graphics processing units (GPUs), digital signal processors (DSPs), and so forth. In one embodiment, each processor core within core complex 105A-N includes a cache subsystem with one or more levels of caches.

Memory controller(s) 130 are representative of any number and type of memory controllers accessible by core complexes 105A-N. Memory controller(s) 130 are coupled to any number and type of memory devices (not shown). For example, the type of memory in memory device(s) coupled to memory controller(s) 130 can include Dynamic Random Access Memory (DRAM), Static Random Access Memory (SRAM), NAND Flash memory, NOR flash memory, Ferroelectric Random Access Memory (FeRAM), or others. I/O interfaces 120 are representative of any number and type of I/O interfaces (e.g., peripheral component interconnect (PCI) bus, PCI-Extended (PCI-X), PCIE (PCI Express) bus, gigabit Ethernet (GBE) bus, universal serial bus (USB)). Various types of peripheral devices can be coupled to I/O interfaces 120. Such peripheral devices include (but are not limited to) displays, keyboards, mice, printers, scanners, joysticks or other types of game controllers, media recording devices, external storage devices, network interface cards, and so forth. Power management unit 145 manages the power consumption of the various components of system 100 by changing the power states of these components. For example, when a component has been idle for a threshold amount of time, power management unit 145 can put the component into a power-gated mode to reduce the power consumption of system 100.

In various embodiments, computing system 100 can be a server, computer, laptop, mobile device, game console, streaming device, wearable device, or any of various other types of computing systems or devices. It is noted that the number of components of computing system 100 can vary from embodiment to embodiment. For example, there can be more or fewer of each component than the number shown in FIG. 1. It is also noted that computing system 100 can include other components not shown in FIG. 1. Additionally, in other embodiments, computing system 100 can be structured in other ways than shown in FIG. 1.

Figure 2:
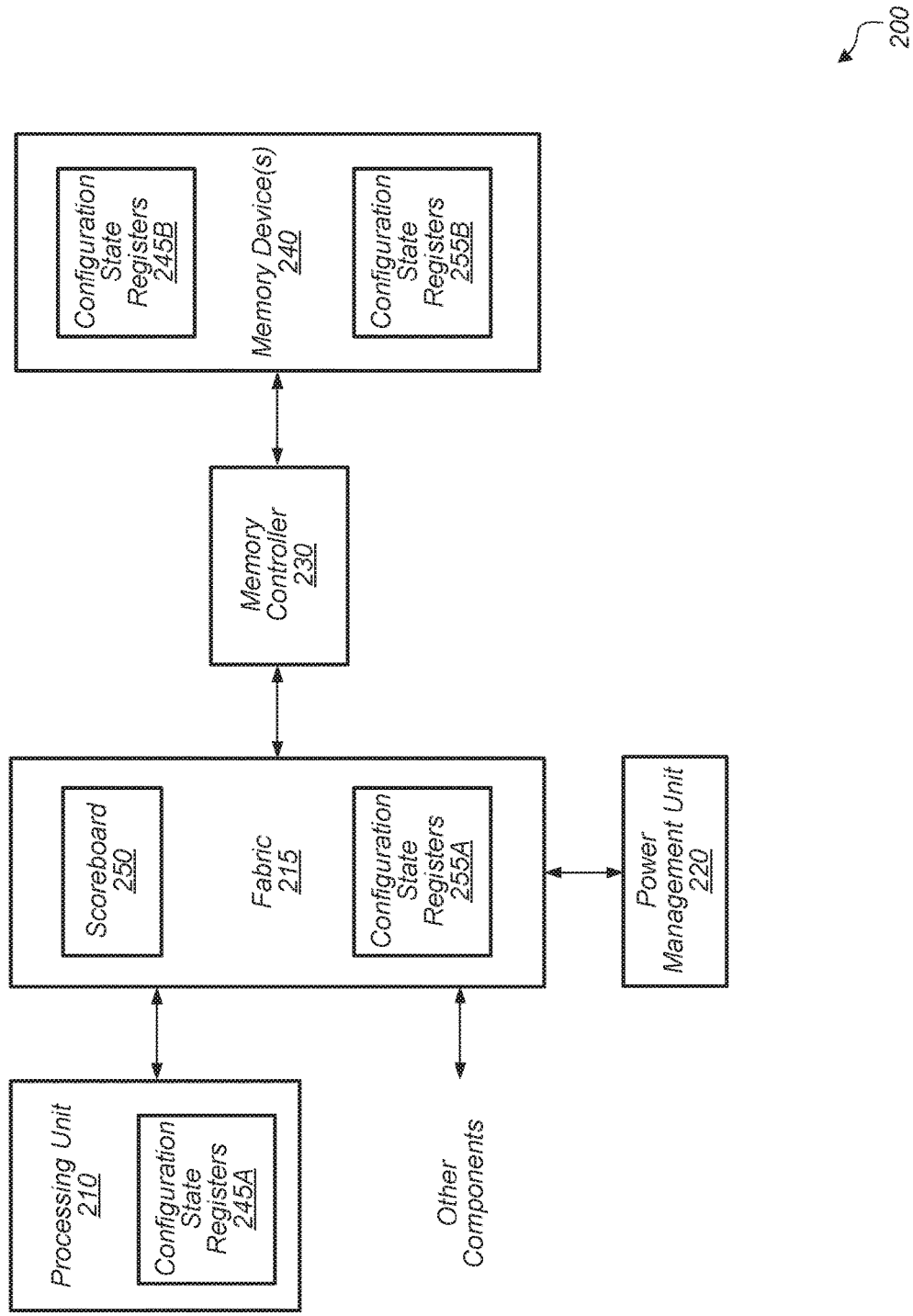
FIG. 2 is a block diagram of another embodiment of a computing system.

Turning now to FIG. 2, a block diagram of another embodiment of a computing system 200 is shown. In one embodiment, computing system 200 includes at least processing unit 210, fabric 215, power management unit 220, memory controller 230, and memory device(s) 240. In other embodiments, computing system 200 can include other components and/or computing system 200 can be arranged differently. Additionally, although one instance of a component is shown in FIG. 2, it should be understood that in other embodiments, system 200 can include multiple instances of the components shown in FIG. 2. For example, in another embodiment, computing system 200 can include additional processing units, memory controllers, and so forth.

Processing unit 210 is representative of any number and type of processing units. Processing unit 210 can include any number of cores, with each core including any number of execution units for executing software instructions, and a cache subsystem for caching data used by the cores. Processing unit 210 also includes configuration state registers 245A for storing the state of processing unit 210. When power management unit 220 detects a condition for putting processing unit 210 into a power-gated mode, the values of configuration state registers 245A are stored to memory device(s) 240. The stored versions of configuration state registers 245A are shown as configuration state registers 245B in memory device(s) 240. Memory device(s) 240 are representative of any number and type of memory devices which are included within system 200. For example, in one embodiment, memory device(s) 240 are implemented with DRAM devices. In other embodiments, other types of memory devices (e.g., static random-access memory (SRAM), non-volatile RAM, etc.) can be used to implement memory device(s) 240.

As used herein, the term "low-power mode" can be defined as a reduced power state for operating a component or device. In one embodiment, "low-power mode" involves removing power from (i.e., power-gating) the component or device. In another embodiment, "low-power mode" involves putting the component or device into a lower power state so as to reduce the power consumption of the component or device. For example, the component/device can be put into a lower power state by reducing the voltage and/or clock frequency supplied to the component/device.

Rather than writing the entirety of configuration state registers 245A to memory device(s) 240 each time processing unit 210 enters the power-gated mode, scoreboard 250 can be used to track which registers have been updated since the last time processing unit 210 entered power-gated mode. Then, the next time processing unit 210 is about to enter power-gated mode, only the subset of registers which have been updated are written to memory device(s) 240. The other registers which have not been updated will already have their existing values stored in configuration state registers 245B in memory device(s) 240. Scoreboard 250 can be implemented using any suitable structure. For example, in one embodiment, scoreboard 250 is implemented using flip-flops. In other embodiments, scoreboard 250 can be implemented using other types of storage elements. While scoreboard 250 is shown as being stored within fabric 215, it is noted that in other embodiments, scoreboard 250 can be stored in other locations. The use of scoreboard 250 helps to reduce the amount of data written to memory device(s) 240 when transitioning into power-gated mode. The use of scoreboard 250 also helps to reduce the latency in transitioning into power-gated mode, which increases the total amount of time processing unit 210 can spend in power-gated mode.

Fabric 215 is representative of any type of communication fabric, bus, and/or other control and interface logic. Fabric 215 is representative of any communication interconnect and any protocol can be used for communicating among the components of the system 200. Fabric 215 provides the data paths, switches, routers, and other logic that connect the processing unit 210, power management unit 220, memory controller 230, and other components to each other. Fabric 215 handles the request, response, and data traffic, as well as probe traffic to facilitate coherency. Fabric 215 also handles interrupt request routing and configuration access paths to the various components of system 200. Additionally, fabric 215 handles configuration requests, responses, and configuration data traffic. Fabric 215 can be bus-based, including shared bus configurations, crossbar configurations, and hierarchical buses with bridges. Fabric 215 can also be packet-based, and can be hierarchical with bridges, crossbar, point-to-point, or other interconnects.

In one embodiment, fabric 215 has a configuration space which is represented by configuration state registers 255A. These configuration state registers 255A can include any number and type of registers, such as routing tables, address maps, configuration data, buffer allocation information, and so on. When power management unit 220 detects an idle condition for fabric 215, power management unit 220 can put fabric 215 into a power-gated mode to conserve power. Prior to fabric 215 entering power-gated mode, configuration state registers 255A are saved to memory device(s) 240 since these values will be lost when fabric 215 goes into power-gated mode. When configuration state registers 255A are written to memory device(s) 240, these values are shown as configuration state registers 255B in memory device(s) 240. To avoid having to write back all of the values of configuration state registers 255A to memory device(s) 240 on each transition into power-gated mode, scoreboard 250 can be used to track which ones of the configuration state registers 255A have changed. Alternatively, a different scoreboard can be used to track updates to configuration state registers 255A. Depending on the embodiment, a single scoreboard 250 can track sets of configuration state registers for multiple components, or a separate scoreboard 250 can be used for each separate component whose configuration state registers are being tracked. In either case, only those registers of configuration state registers 255A which have been updated since a previous transition of fabric 215 into power-gated mode are written back to memory device(s) 240. This helps to increase the efficiency of the process by which fabric 215 enters power-gated mode. It is noted that any number of other components of system 200 can also include configuration state registers which are tracked by scoreboard 250 (or another scoreboard structure) for determining which registers have been updated and need to be written to memory device(s) 240 upon transition of the component into power-gated mode.

In one embodiment, power management unit 220 manages the power-gating of the different components of system 200. As used herein, the term "power-gate" is defined as reducing the power consumption of one or more components. The term "power-gate" can also be defined as putting a component into a low power state. A "low power state" as defined herein can be a state in which a voltage supplied to the component is reduced from its maximum, a state in which the frequency of the clock signal is reduced from its maximum, a state in which the clock signal is inhibited from the component (clock-gated), one in which power is removed from the component, or a combination of any of the former. To bring a given component out of power-gated mode, power management unit 220 can increase or turn on the supply voltage(s) and/or clock(s) being supplied to the given component. Power management unit 220 can receive control signals from one or more other units, such as a timer, interrupt unit, processing unit, and the like, for determining when to transition between different power states for the various components.

Figure 3:
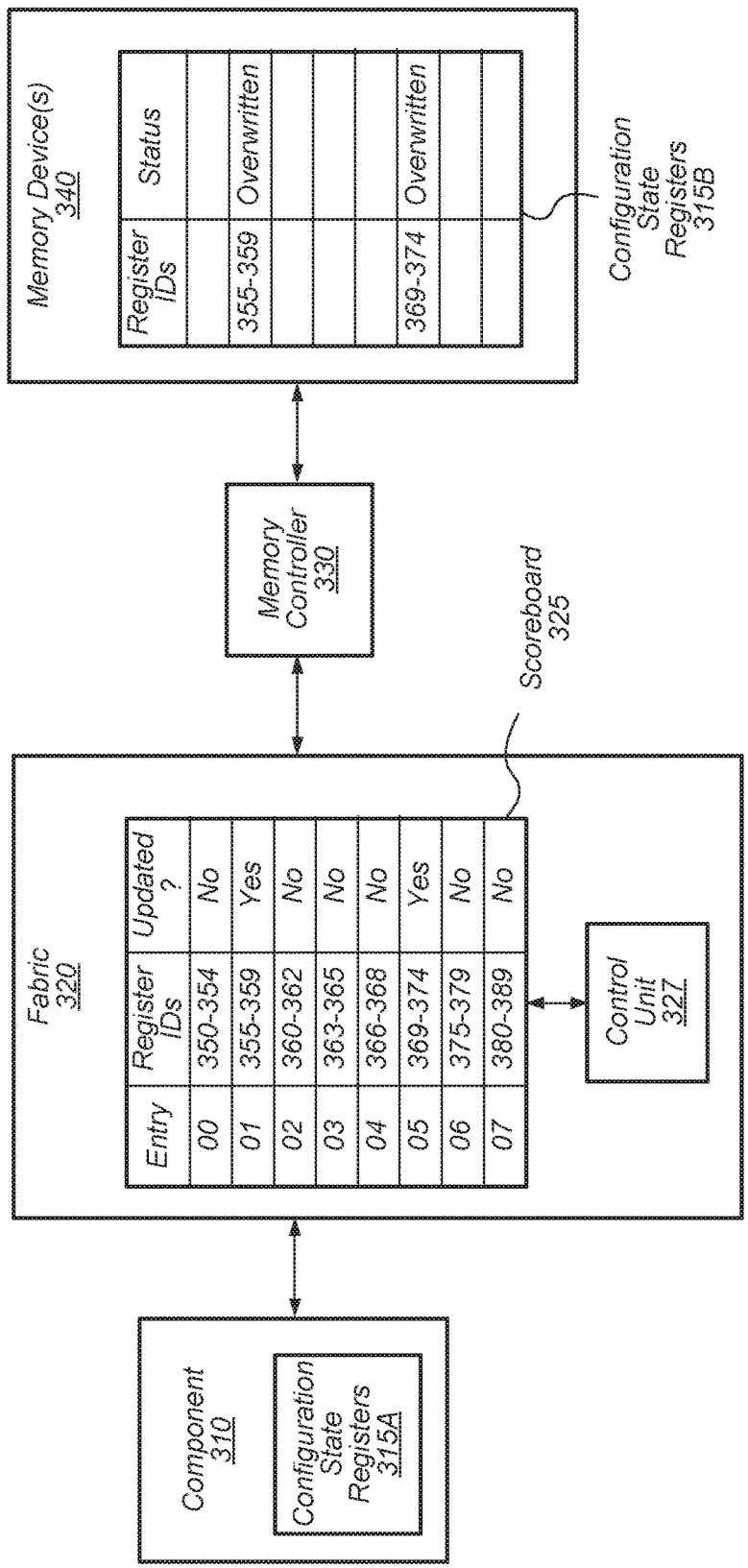
FIG. 3 is a block diagram of another embodiment of a computing system.

Referring now to FIG. 3, a block diagram of another embodiment of a computing system 300 is shown. Computing system 300 includes at least component 310, fabric 320, memory controller 330, and memory device(s) 340. It is noted that system 300 can include any number of other components in addition to those shown in FIG. 3. It is also noted that system 300 can be any of the previous listed types of computing systems, depending on the embodiment. Component 310 is representative of any type of component that can be included in system 300. Depending on the embodiment, component 310 can be a processing unit, processing core, processing node, I/O or peripheral device, fabric component, fabric region, or other type of component or device.

In one embodiment, component 310 includes a plurality of configuration state registers 315A. These configuration state registers 315A can include any number and type of storage elements for storing values representative of the configuration state of component 310. When component 310 goes into power-gated mode, only those registers 315A which have changed since a previous transition into power-gated mode are written to memory device(s) 340. In one embodiment, scoreboard 325 is used to track which registers 315A have been recently updated. While scoreboard 325 is shown as being stored in fabric 320, it should be understood that scoreboard 325 can be stored in other locations in other embodiments. Additionally, scoreboard 325 is coupled to control unit 327, and control unit 327 manages the entries of scoreboard 325 and determines which registers 315A are written back to memory device(s) 340 when component 310 transitions into power-gated mode. Control unit 327 can be implemented using any suitable combination of software and/or hardware.

Scoreboard 325 can include any number of entries, with the number of entries varying from embodiment to embodiment. While scoreboard 325 is shown as including eight entries, it should be understood that this is merely indicative of one embodiment. In other embodiments, scoreboard 325 can include other numbers of entries. In one embodiment, each entry of scoreboard 325 is used to track a plurality of registers from configuration state registers 315A. In one embodiment, the granularity of tracking by each entry of scoreboard 325 matches the granularity of an access to memory device(s) 340. In other words, each entry of scoreboard 325 tracks an amount of data which can be written to memory device(s) 340 in a single access. For example, if the access granularity to memory device(s) 340 is 64 bytes (in one embodiment), then each entry of scoreboard 325 tracks 64 bytes worth of registers.

As shown in FIG. 3, scoreboard 325 includes eight entries labeled as 00-07. In one embodiment, each entry of scoreboard 325 includes an entry ID, register IDs or addresses for the registers being tracked, and an updated indication to specify if any register in the group of registers being tracked has been updated since a previous transition into power-gated mode by component 310. As indicated by scoreboard 325, the groups of registers corresponding to entries 01 and 05 have been updated while the other groups of registers corresponding to the other entries have not been updated. Accordingly, if a condition for component 310 to enter power-gated mode is detected, then only those groups of registers corresponding to entries 01 and 05 will be written to configuration state registers 315B in memory device(s) 340.

Additionally, when component 310 goes into the power-gated mode, the entries of scoreboard 325 are reset. Alternatively, the entries of scoreboard 325 can be reset when component 310 exits the power-gated mode. In either case, after component 310 exits the power-gated mode, all entries of scoreboard 325 will indicate that configuration state registers 315A have not changed. Only changes to configuration state registers 315A after component 310 is powered up again will be reflected in scoreboard 325 after the exit from the power-gated mode. It is noted that fabric 320 can also include any number of other scoreboards to track updates to configuration state registers for any number of other components.

Figure 4:
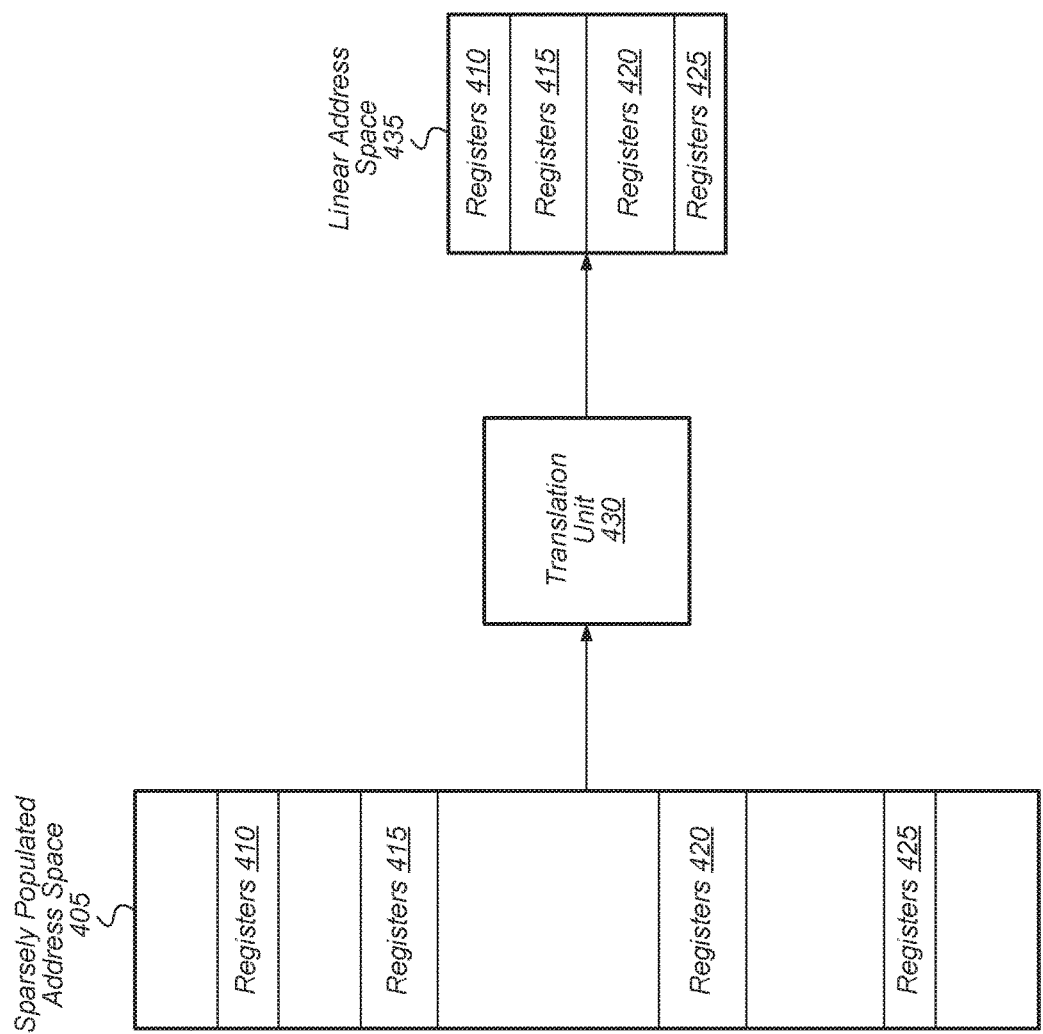
FIG. 4 is a diagram of one embodiment of address stitching configuration state registers into a linear address space.

Turning now to FIG. 4, one embodiment of address stitching configuration state registers into a linear address space 435 is shown. In one embodiment, a set of configuration state registers (for a given component) includes registers 410, 415, 420, and 425. Registers 410, 415, 420, and 425 are representative of any number and type of registers that define the configuration space for a given component. In one embodiment, registers 410, 415, 420, and 425 are distributed throughout a sparsely populated address space 405. In other words, there are large gaps between the addresses of registers 410, 415, 420, and 425 in sparsely populated address space 405.

Rather than attempt to track and store registers 410, 415, 420, and 425 from the sparsely populated address space 405, translation unit 430 maps registers 410, 415, 420, and 425 from the sparsely populated address space 405 into linear address space 435. It is noted that translation unit 430 can also be referred to as a control unit. As shown on the right-side of FIG. 4, registers 410, 415, 420, and 425 are remapped such that they now occupy contiguous addresses in linear address space 435. When a computing system tracks updates to registers 410, 415, 420, and 425, the computing system uses a scoreboard which is implemented in linear address space 435. Accordingly, when a computing system needs to write register values to memory when the given component enters power-gated mode, the computing system uses the addresses of registers 410, 415, 420, and 425 from linear address space 435 to reduce the amount of data which needs to be stored to memory.

Figure 5:
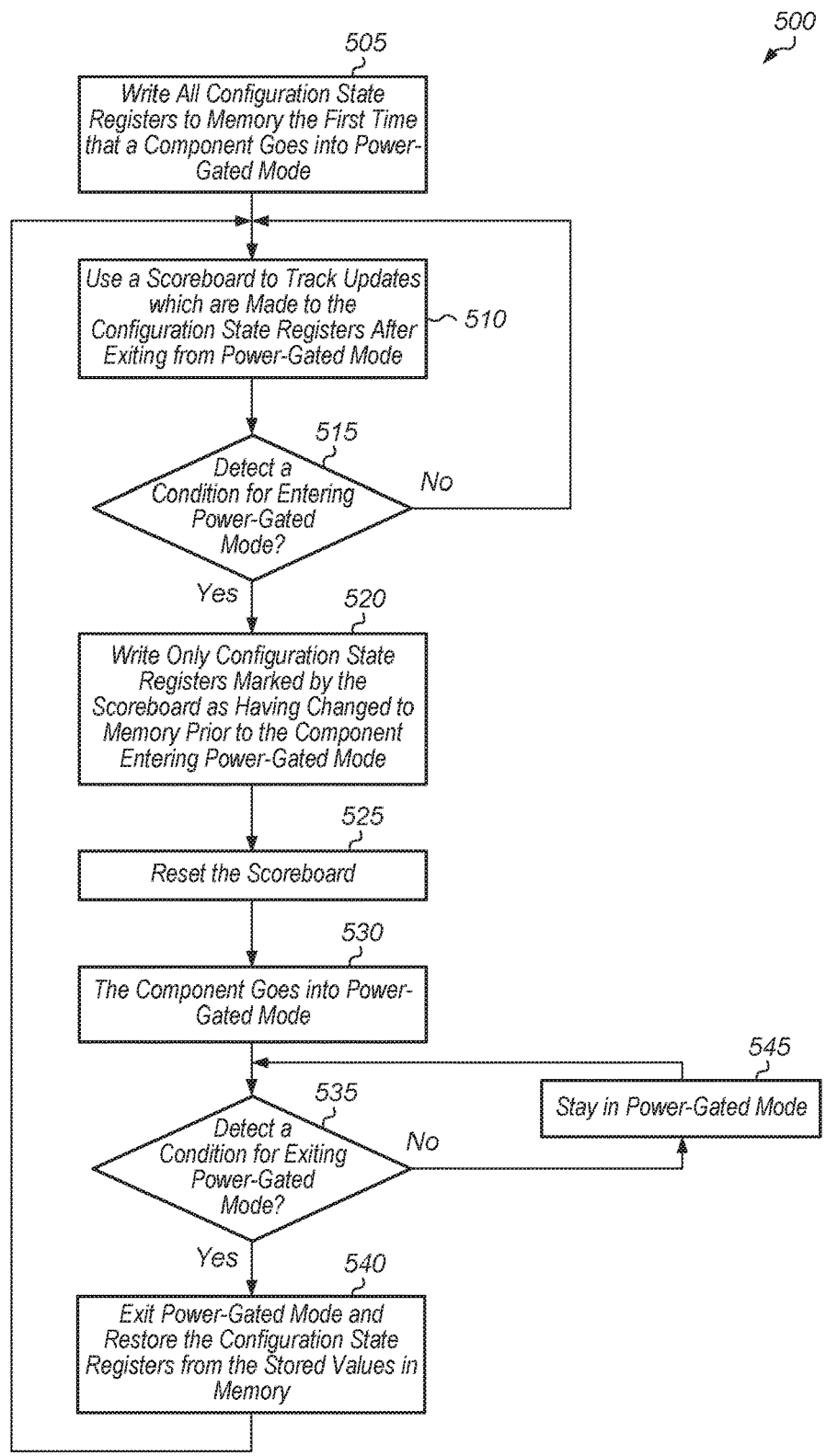
FIG. 5 is a generalized flow diagram illustrating one embodiment of a method for using a scoreboard to track configuration state register writes.
Figure 6:
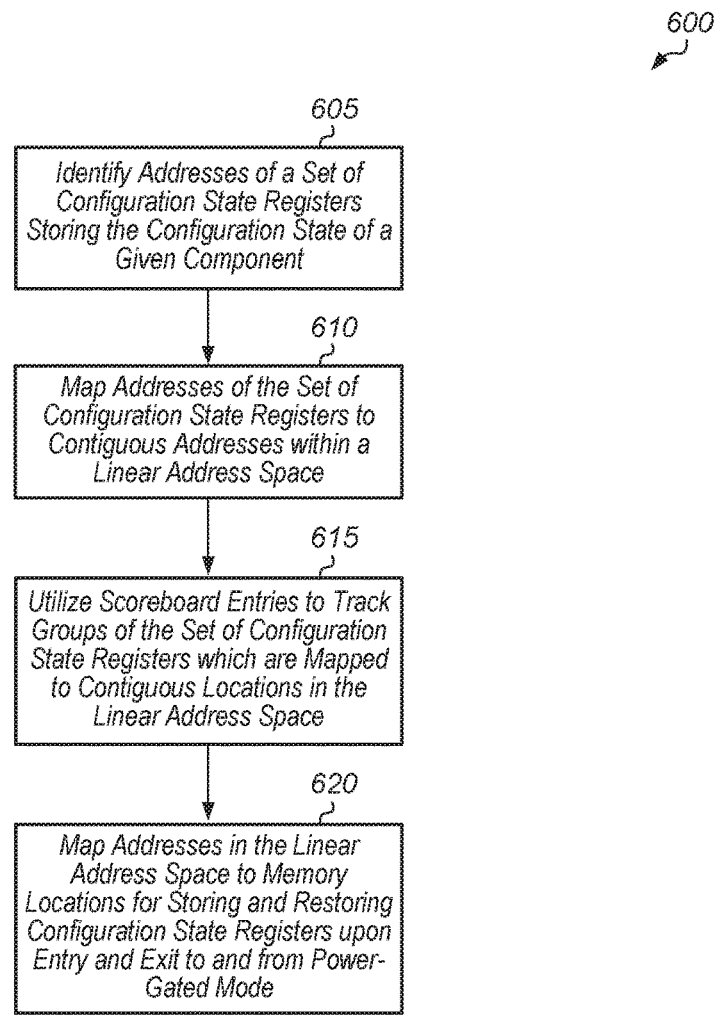
FIG. 6 is a generalized flow diagram illustrating one embodiment of a method for performing configuration state register address stitching.
Figure 7:
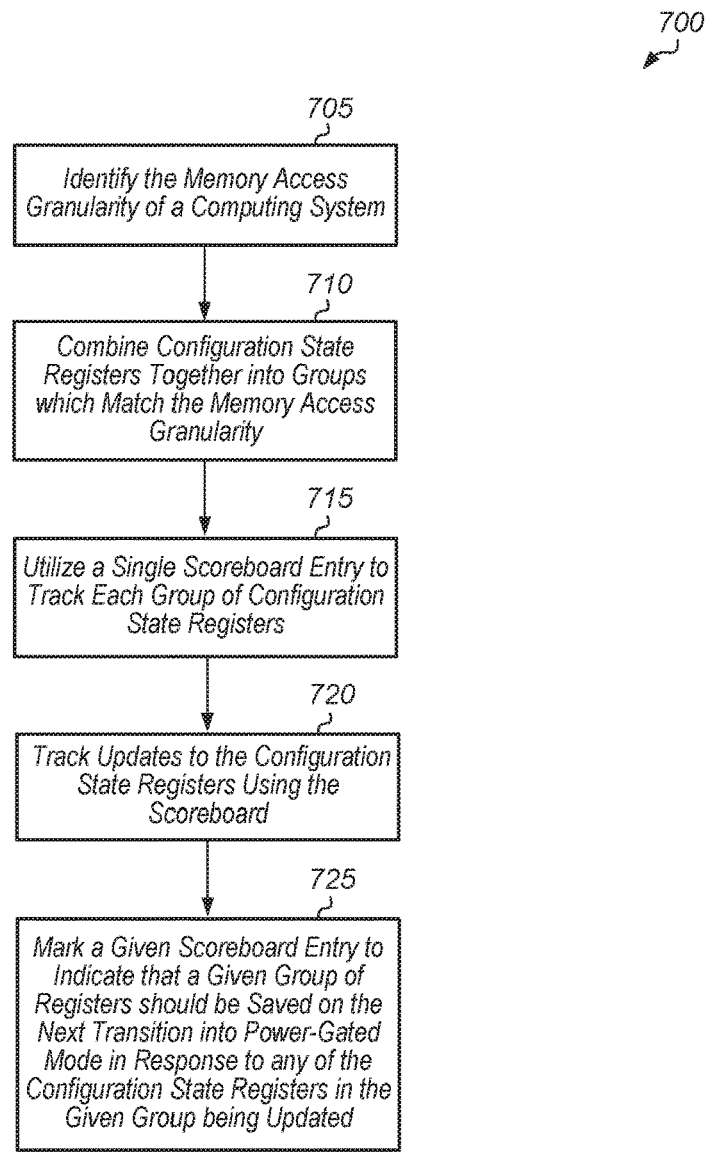
FIG. 7 is a generalized flow diagram illustrating one embodiment of a method for matching scoreboard entry tracking to memory access granularity.

Referring now to FIG. 5, one embodiment of a method 500 for using a scoreboard to track configuration state register writes is shown. For purposes of discussion, the steps in this embodiment and those of FIG. 6-7 are shown in sequential order. However, it is noted that in various embodiments of the described methods, one or more of the elements described are performed concurrently, in a different order than shown, or are omitted entirely. Other additional elements are also performed as desired. Any of the various systems or apparatuses described herein can implement method 500.

A component writes all configuration state registers to memory (e.g., DRAM) the first time that the component goes into power-gated mode (block 505). Depending on the embodiment, the component can be a processing node, a processing unit, a processor core, a fabric, a portion of a fabric, or another type of component or computing device. Next, after exiting from power-gated mode, the component uses a scoreboard to track updates which are made to the configuration state registers (block 510). If the component detects a condition for entering power-gated mode (conditional block 515, "yes" leg), then the component writes only those configuration state registers marked by the scoreboard as having changed to memory (e.g., DRAM) prior to the component entering power-gated mode (block 520). In one embodiment, a condition for entering power-gated mode includes detecting that the component is idle for a threshold amount of time. Additionally, the scoreboard is reset to clear out any entries which are marked (block 525). Next, the component goes into power-gated mode (block 530). If the component does not detect a condition for entering power-gated mode (conditional block 515, "no" leg), then method 500 returns to block 510.

After block 530, if the component detects a condition for exiting power-gated mode (conditional block 535, "yes" leg), then the component exits power-gated mode and restores the configuration state registers from the stored values in memory (block 540). In one embodiment, a condition for exiting power-gated mode includes an interrupt which is generated to wake up the component. After block 540, method 500 returns to block 510. If the component does not detect a condition for exiting power-gated mode (conditional block 535, "no" leg), then the component stays in power-gated mode (block 545). After block 545, method 500 returns to conditional block 535. It is noted that multiple instances of method 500 can be performed in parallel for a plurality of components of a computing system.

Turning now to FIG. 6, one embodiment of a method 600 for performing configuration state register address stitching is shown. A control unit identifies addresses of a set of configuration state registers storing the configuration state of a given component (block 605). In one embodiment, the configuration state registers are sparsely mapped within the physical address space of the host computing system, with large gaps between various registers.

Next, the control unit maps addresses of the set of configuration state registers to contiguous addresses within a linear address space (block 610). Then, the given component uses scoreboard entries to track groups of the set of configuration state registers which are mapped to contiguous locations in the linear address space (block 615). Also, the system maps addresses in the linear address space to memory locations for storing and restoring the configuration state registers upon entry and exit to and from power-gated mode (block 620). After block 620, method 600 ends.

Referring now to FIG. 7, one embodiment of a method 700 for matching scoreboard entry tracking to memory access granularity is shown. A control unit identifies the memory access granularity of a computing system (block 705). In one embodiment, a register or other storage element can store an indication of the memory access granularity. In another embodiment, the control unit performs a memory access to determine the memory access granularity. Next, the control unit combines configuration state registers together into groups which match the memory access granularity (block 710). For example, in one embodiment, the memory access granularity is 64 bytes, and the control unit groups configuration state registers into 64-byte groups. The control unit can perform these steps for a single component of the computing system or for multiple components of the computing system. In some cases, more than one control unit within the computing system can perform the steps of method 700 for the different components of the computing system.

Also, the control unit uses a single scoreboard entry to track each group of configuration state registers (block 715). Then, the control unit tracks updates to the configuration state registers using the scoreboard (block 720). The system marks a given scoreboard entry to indicate that a given group of registers should be saved on the next transition into power-gated mode in response to any of the configuration state registers in the given group being updated (block 725). After block 725, method 700 ends.

In various embodiments, program instructions of a software application are used to implement the methods and/or mechanisms described herein. For example, program instructions executable by a general or special purpose processor are contemplated. In various embodiments, such program instructions can be represented by, a high level programming language. In other embodiments, the program instructions can be compiled from a high level programming language to a binary, intermediate, or other form. Alternatively, program instructions can be written that describe the behavior or design of hardware. Such program instructions can be represented by a high-level programming language, such as C. Alternatively, a hardware design language (HDL) such as Verilog can be used. In various embodiments, the program instructions are stored on any of a variety of non-transitory computer readable storage mediums. The storage medium is accessible by a computing system during use to provide the program instructions to the computing system for program execution. Generally speaking, such a computing system includes at least one or more memories and one or more processors that can execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A system comprising:
one or more processing nodes;
a memory; and
a plurality of configuration state registers;
wherein the system is configured to:
maintain a scoreboard to track which of the plurality of configuration state registers have been updated since a previous transition of a given processing node to a power-gated state, wherein said scoreboard comprises one or more entries that include an identification of a configuration register and an indication as to whether the configuration register has been updated since a previous transition of a given processing node to a power-gated state; and
responsive to detecting a condition for transitioning the given processing node into the power-gated state, write only a subset of the plurality of configuration state registers to the memory, wherein the subset is indicated by the scoreboard.

2. The system as recited in claim 1, wherein the system is further configured to maintain entries in the scoreboard at a granularity that matches a memory access granularity.

3. The system as recited in claim 1, wherein:
multiple configuration state registers are collectively tracked by a single scoreboard entry; and
a combined size of the multiple configuration state registers matches the memory access granularity.

4. The system as recited in claim 1, wherein the system is further configured to map configuration state registers to contiguous addresses of a linear address space.

5. The system as recited in claim 4, wherein the system is further configured to map addresses in the linear address space to addresses in the memory for storing and restoring the configuration state registers.

6. The system as recited in claim 1, wherein the system is further configured to reset the scoreboard in response to the given processing node transitioning into the power-gated state.

7. The system as recited in claim 1, wherein the system is further configured to restore the plurality of configuration state registers from stored values in the memory responsive to the given processing node exiting the power-gated state.

8. A method comprising:
maintaining, by a control unit, a scoreboard to track which of a plurality of configuration state registers have been updated since a previous transition of a given component to a power-gated state, wherein said scoreboard comprises one or more entries that include an identification of a configuration register and an indication as to whether the configuration register has been updated since a previous transition of a given processing node to a power-gated state;
responsive to detecting an update to a given configuration state register, storing, by the control unit, an indication in a corresponding entry in the scoreboard; and
responsive to detecting a condition for transitioning the given component into the power-gated state, writing, by the given component, only a subset of the plurality of configuration state registers to a memory, wherein the subset is indicated by the scoreboard.

9. The method as recited in claim 8, further comprising maintaining entries in the scoreboard at a granularity that matches a memory access granularity.

10. The method as recited in claim 8, wherein:
multiple configuration state registers are collectively tracked by a single scoreboard entry; and
a combined size of the multiple configuration state registers matches the memory access granularity.

11. The method as recited in claim 8, further comprising mapping configuration state registers to contiguous addresses of a linear address space.

12. The method as recited in claim 11, further comprising mapping addresses in the linear address space to addresses in the memory for storing and restoring the configuration state registers.

13. The method as recited in claim 8, further comprising resetting the scoreboard in response to the given component transitioning into the power-gated state.

14. The method as recited in claim 8, further comprising restoring the plurality of configuration state registers from stored values in the memory responsive to the given component exiting the power-gated state.

15. An apparatus comprising:
a processing node;
a control unit; and
a memory;
wherein the control unit is configured to:
maintain a scoreboard to track which of a plurality of configuration state registers have been updated since a previous transition of a given processing node to a power-gated state, wherein said scoreboard comprises one or more entries that include an identification of a configuration register and an indication as to whether the configuration register has been updated since a previous transition of a given processing node to a power-gated state;
responsive to detecting a condition for transitioning the given processing node into the power-gated state, write only a subset of the plurality of configuration state registers to the memory, wherein the subset is indicated by the scoreboard.

16. The apparatus as recited in claim 15, wherein the control unit is further configured to maintain entries in the scoreboard at a granularity that matches a memory access granularity.

17. The apparatus as recited in claim 15, wherein:
multiple configuration state registers are collectively tracked by a single scoreboard entry; and
a combined size of the multiple configuration state registers matches the memory access granularity.

18. The apparatus as recited in claim 15, wherein the control unit is further configured to map configuration state registers to contiguous addresses of a linear address space.

19. The apparatus as recited in claim 18, wherein the control unit is further configured to map addresses in the linear address space to addresses in the memory for storing and restoring the configuration state registers.

20. The apparatus as recited in claim 15, wherein the control unit is further configured to reset the scoreboard in response to the given processing node transitioning into the power-gated state.

* * * * *